United States Patent
Chen et al.

(10) Patent No.: US 10,966,345 B2
(45) Date of Patent: Mar. 30, 2021

(54) SOLID-STATE DRIVE HEAT DISSIPATION DEVICE

(71) Applicant: APACER TECHNOLOGY INC., New Taipei (TW)

(72) Inventors: Chien-Pang Chen, New Taipei (TW); Min-Lung Lin, New Taipei (TW); Chih-Hung Kuo, New Taipei (TW); Sung-Yu Tsai, New Taipei (TW)

(73) Assignee: Apacer Technology Inc., New Taipei (TW)

( * ) Notice: Subject to any disclaimer, the term of this patent is extended or adjusted under 35 U.S.C. 154(b) by 0 days.

(21) Appl. No.: 16/739,238

(22) Filed: Jan. 10, 2020

(65) Prior Publication Data
US 2020/0375064 A1 Nov. 26, 2020

(30) Foreign Application Priority Data

May 24, 2019 (TW) .................................. 108206633

(51) Int. Cl.
*H05K 7/20* (2006.01)
*G06F 1/20* (2006.01)

(52) U.S. Cl.
CPC ........... *H05K 7/20172* (2013.01); *G06F 1/20* (2013.01); *H05K 7/20409* (2013.01)

(58) Field of Classification Search
None
See application file for complete search history.

(56) References Cited

U.S. PATENT DOCUMENTS

| | | | | |
|---|---|---|---|---|
| 5,276,289 A * | 1/1994 | Satoh | ..................... | B23K 35/30 174/260 |
| 6,281,573 B1 * | 8/2001 | Atwood | .............. | H01L 23/3675 165/80.3 |
| 8,787,022 B2 * | 7/2014 | Moriai | .................. | H01L 23/552 361/720 |
| 8,913,389 B2 * | 12/2014 | Fukui | ................. | H05K 7/20518 361/710 |
| 9,117,792 B2 * | 8/2015 | Yang | ....................... | H01L 23/36 |
| 10,499,507 B2 * | 12/2019 | Kim | .................... | H01L 25/0652 |
| 10,551,885 B2 * | 2/2020 | Kim | .......................... | G06F 1/20 |
| 10,775,576 B2 * | 9/2020 | Meade | ................... | H01L 25/165 |
| 2003/0218850 A1 * | 11/2003 | Kubo | .................... | H01L 23/467 361/103 |
| 2011/0012255 A1 * | 1/2011 | Suganuma | ............ | H01L 23/433 257/712 |
| 2016/0270251 A1 * | 9/2016 | Sugita | ....................... | G06F 1/20 |

* cited by examiner

*Primary Examiner* — Courtney L Smith
(74) *Attorney, Agent, or Firm* — Winston Hsu

(57) ABSTRACT

A solid-state drive (SSD) heat dissipation device is disclosed. The SSD heat dissipation device comprises a solid-state drive substrate, a chip heat dissipation component, a memory heat dissipation component, and a spacer. A control IC and a flash memory are disposed on the solid-state drive substrate, the chip heat dissipation component is disposed on the control IC, and the memory heat dissipation component is disposed on the flash memory. The chip heat dissipation component and the memory heat dissipation component are disposed separately.

9 Claims, 5 Drawing Sheets

SOLID-STATE DRIVE HEAT DISSIPATION DEVICE

CROSS-REFERENCE TO RELATED APPLICATION

This application claims priority from Taiwan Patent Application No. 108206633, filed on May 24, 2019, at the Taiwan Intellectual Property Office, the content of which is hereby incorporated by reference in its entirety for all purposes.

BACKGROUND OF THE INVENTION

1. Field of the Invention

The disclosure is related to a solid-state drive heat dissipation device, and more particularly to a solid-state drive heat dissipation device that a heat dissipation component of a control IC and a heat dissipation component of flash memory are separately disposed to avoid the mutual influence of heat generated by each other.

2. Description of the Related Art

Solid-state drives (SSD) are a kind of computer storage device that is mainly used flash memory for storage. Due to its advantages of small size, large capacity, no noise and anti-knock effect, the use of solid-state drives has been supported by many users of the hardware of desktop computers or notebook computers. In addition, solid-state drives are far superior to traditional hard drives in terms of read and write speeds. For those people of pursuing computer speed or performance, the use of solid-state drives is undoubtedly an option.

However, while pursuing high speed, electronic components inevitably generate heat, and excessive heat may affect the operational efficiency of electronic components or even cause damage to electronic components. Therefore, most electronic devices will design a related heat dissipation mechanism, so that the heat source generated during operation can be derived, and the performance and service life are prevented from falling due to overheating. In the case of the M.2 type solid-state drive, the control IC and the flash memory that store the data also have the problem of heat dissipation during high-speed operation. Even if the control IC is designed with the relevant over-temperature protection mechanism added, when the operating temperature is too high, the processing speed can be adjusted to protect the chip, avoiding problems in data transmission. However, for flash memory, a temperature too high may still cause damage to the components, which in turn creates a risk of losing stored data.

At present, the main heat dissipation method is to design a heat dissipation component covering the entire solid-state drive, such as a heat dissipation fin, a fan, etc., to dissipate heat from the entire solid-state drive. Although a larger area of the heat dissipation fins may have a better heat conduction effect, in the solid-state drive, the heat generated by the control IC may be directed to the flash memory, causing the component to overheat. As mentioned above, the Control IC may have an over-temperature protection mechanism, but the flash memory may lose data due to overheating, resulting in an unrecoverable defect.

As mentioned above, the conventional solid-state drive heat dissipation device still has considerable doubts about the overall heat dissipation effect, and it is difficult to balance all components. Therefore, the inventor of this invention contemplates and designs a solid-state drive heat dissipation device comprising a spacer to improve the drawbacks of prior arts, thereby enhancing the industrial implementation.

SUMMARY OF THE INVENTION

In view of the above-mentioned problems of the prior art, an aspect of this invention is to provide a solid-state drive heat dissipation device to solve the problem that the conventional solid-state drive heat dissipation structure cannot achieve the operational reliability of each component.

According to one aspect of this invention, a solid-state drive heat dissipation device comprising a solid-state drive substrate, a chip heat dissipation component, and a memory heat dissipation component is provided. A control IC and a flash memory are disposed on the solid-state drive substrate, the chip heat dissipation component is disposed on the control IC, and the memory heat dissipation component is disposed on the flash memory, where the chip heat dissipation component and the memory heat dissipation component are disposed separately.

In one embodiment, the chip heat dissipation component may comprise a chip heat dissipation sheet disposed on the control IC.

In one embodiment, the chip heat dissipation component may comprise chip heat dissipation fins disposed on the chip heat dissipation sheet.

In one embodiment, the chip heat dissipation component may comprise a chip fan disposed on the chip heat dissipation fins.

In one embodiment, the memory heat dissipation component may comprise a memory heat dissipation sheet disposed on the flash memory.

In one embodiment, the memory heat dissipation component may comprise memory heat dissipation fins disposed on the memory heat dissipation sheet.

In one embodiment, the memory heat dissipation component may comprise a memory fan disposed on the memory heat dissipation fins.

In one embodiment, the chip heat dissipation component may comprise a chip heat dissipation sheet and chip heat dissipation fins. The chip heat dissipation sheet is disposed on the control IC, and the chip heat dissipation fins are disposed on the chip heat dissipation sheet. The memory heat dissipation component may comprise a memory heat dissipation sheet and memory heat dissipation fins. The memory heat dissipation sheet is disposed on the flash memory, and the memory heat dissipation fins are disposed on the memory heat dissipation sheet.

In one embodiment, the chip heat dissipation component may comprise a spacer. The spacer is disposed on the solid-state drive substrate and disposed between the control IC and the flash memory to separate the chip heat dissipation component and the memory heat dissipation component.

As described above, according to this disclosure, the solid-state drive heat dissipation device may have one or more of the following advantages:

(1) The solid-state drive heat dissipation device can dissipate the control IC and the flash memory by the chip heat dissipation component and the memory heat dissipation component respectively, thereby preventing the thermal energy generated by the control IC and the flash memory from interacting to damage the solid-state drive.

(2) The solid-state drive heat dissipation device can improve the heat dissipation efficiency of the whole solid-state drive by providing the heat dissipation sheet, the heat dissipation fins and dissipation fan, so that the components can be optimally used at normal operating temperatures.

BRIEF DESCRIPTION OF THE DRAWINGS

The invention can be more fully understood by reading the following detailed description of the embodiment, with reference made to the accompanying drawings as follows.

DESCRIPTION OF THE PREFERRED EMBODIMENTS

Figure 1:
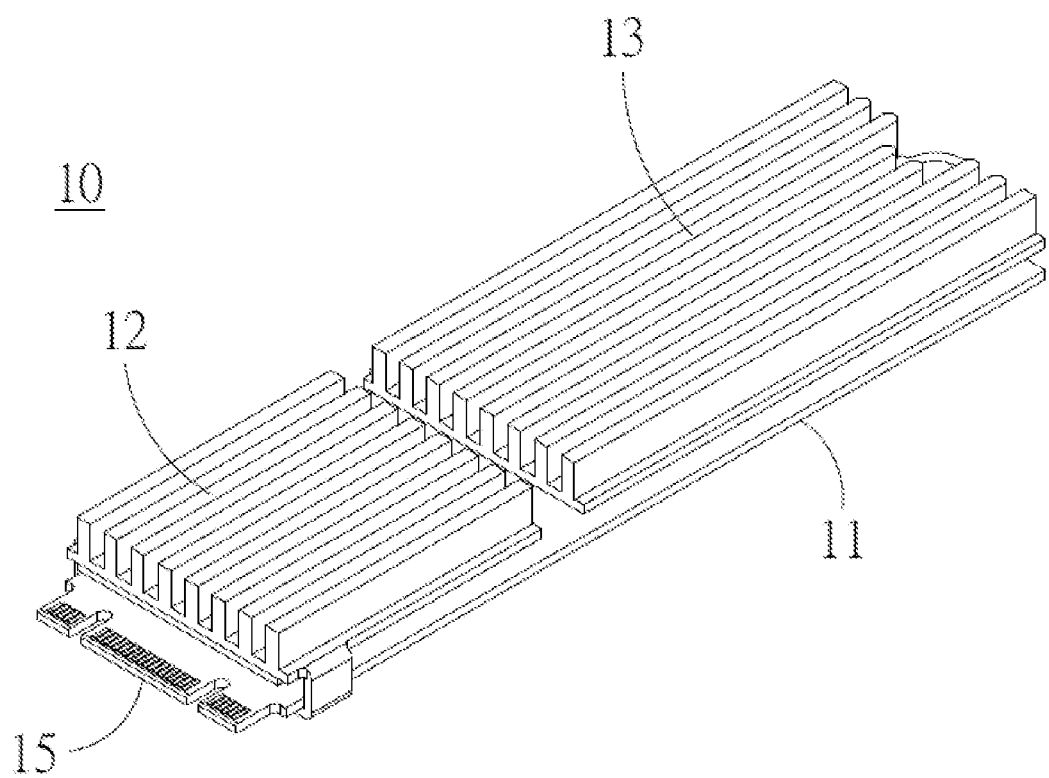
FIG. 1 is a schematic diagram of the solid-state drive heat dissipation device according to one embodiment of the invention.

In order to understand the technical features, contents and advantages of this invention and the effects thereof that can be achieved, the invention will be described in detail with reference to the accompanying drawings, and the drawings used therein are only intended to be used for the purpose of illustration and the supplementary illustration, is not necessarily the true proportion and precise configuration after the implementation of the invention. Therefore, the scope and configuration relationship of the attached drawings should not be interpreted and the scope of the inventor's actual implementation should not be limited.

In the drawings, the thickness or width of layers, films, panels, regions, light guides and the like are exaggerated for the sake of clarity. Throughout the specification, the same reference numerals denote the same components. It will be understood that when an component, such as a layer, a film, a region or a substrate is referred to as being "on" or "connected" to another component, it may be directly on another component or connected to another component, or an intermediate component may also be present. In contrast, when an component is referred to as "directly on" or "directly connected to" another component, "connected," as used herein, may refer to a physical and/or electrical connection. Furthermore, "electrically connected" or "coupled" may be the presence of other components between two components. In addition, it should be understood that the terms "first", "second", and "third" may be used herein to describe various components, units, regions, layers, and/or portions, are described to separate a component, unit, region, layer, and/or portion from another component, unit, region, layer, and/or portion. Therefore, it is for illustrative purposes only and is not to be construed as indicating or implying relative importance or its order.

Unless otherwise defined, all terms (including technical and scientific terms) used herein have the same meaning as commonly understood by one of ordinary skill in the art. It will be further understood that terms such as those defined in commonly used dictionaries should be interpreted as having meaning consistent with their meaning in the context of the related art and the creation, and will not be construed as idealized or excessive. Formal meaning, unless explicitly defined in this article.

Please refer to FIG. 1, which is a schematic diagram of a solid-state drive heat dissipation device according to an embodiment of the invention. As shown, the solid-state drive heat dissipation device 10 comprises a solid-state drive substrate 11, a chip heat dissipation component 12, and a memory heat dissipation component 13. The solid-state drive substrate 11 comprises a control IC and a flash memory disposed thereon. In this embodiment, an M.2 type solid-state drive is taken as an example and one side of the solid-state drive substrate 11 is provided with interface 15 of M.2 may correspond to PCI-E channel or SATA channel. However, this creation is not limited to this, and other types of solid-state drives should also be included in the scope of this creation. The chip heat dissipation component 12 and the memory heat dissipation component 13 are respectively disposed on the solid-state drive substrate 11, the chip heat dissipation component 12 corresponds to the position setting of the control IC, and the memory heat dissipation component 13 corresponds to the position setting of the flash memory.

The chip heat dissipation component 12 can be a heat dissipation sheet, heat dissipation fins or a heat dissipation fan. When the chip heat dissipation component 12 is a heat dissipation sheet or heat dissipation fins, the heat dissipation component can be in contact with the package structure of the control IC. When the chip is in operation, the heat generated by the chip will be dissipated through the contact part, and the material of the heat dissipation sheet or the heat dissipation fins may be a metal with better heat conduction effect. The heat dissipation sheet and the heat dissipation fins may be separately disposed or stacked, and the detailed structure thereof is described in the following embodiments. If the chip heat dissipation component 12 is a heat dissipation fan, the heat may be removed by the airflow generated by the fan without directly contacting the control IC. Similarly, the memory heat dissipation component 13 can also be a heat dissipation sheet, heat dissipation fins or a heat dissipation fan. The flash memory also has a similar chip package structure, and the heat dissipation sheet and the heat dissipation fins can be independently disposed or stacked together. The heat can be conducted by contact, or removed by the fan airflow to achieve the heat dissipation effect.

In this embodiment, the chip heat dissipation component 12 and the memory heat dissipation component 13 are not in contact with each other. Compared with the prior art, which is the chip heat dissipation component 12 and the memory heat dissipation component 13 to be combined to increase the overall heat dissipation area, while the embodiment is separately disposed to avoid the mutual influence of heat generated by each other. In other words, if a large heat dissipation component or heat dissipation fins covering the entire structure is provided, although the heat dissipation area can be increased, the thermal energy of the contact conduction can be transmitted from the control IC end to the flash memory end (may also be transmitted from the flash memory end to the control IC end), causing the operating temperature to be raised and the electronic component to be overheated. In this embodiment, the thermal energy is respectively conducted by the chip heat dissipation component 12 and the memory heat dissipation component 13, and hence no problems of decreasing the overall solid-state drive performance or data loss is produced by the mutual influence.

Figure 2:
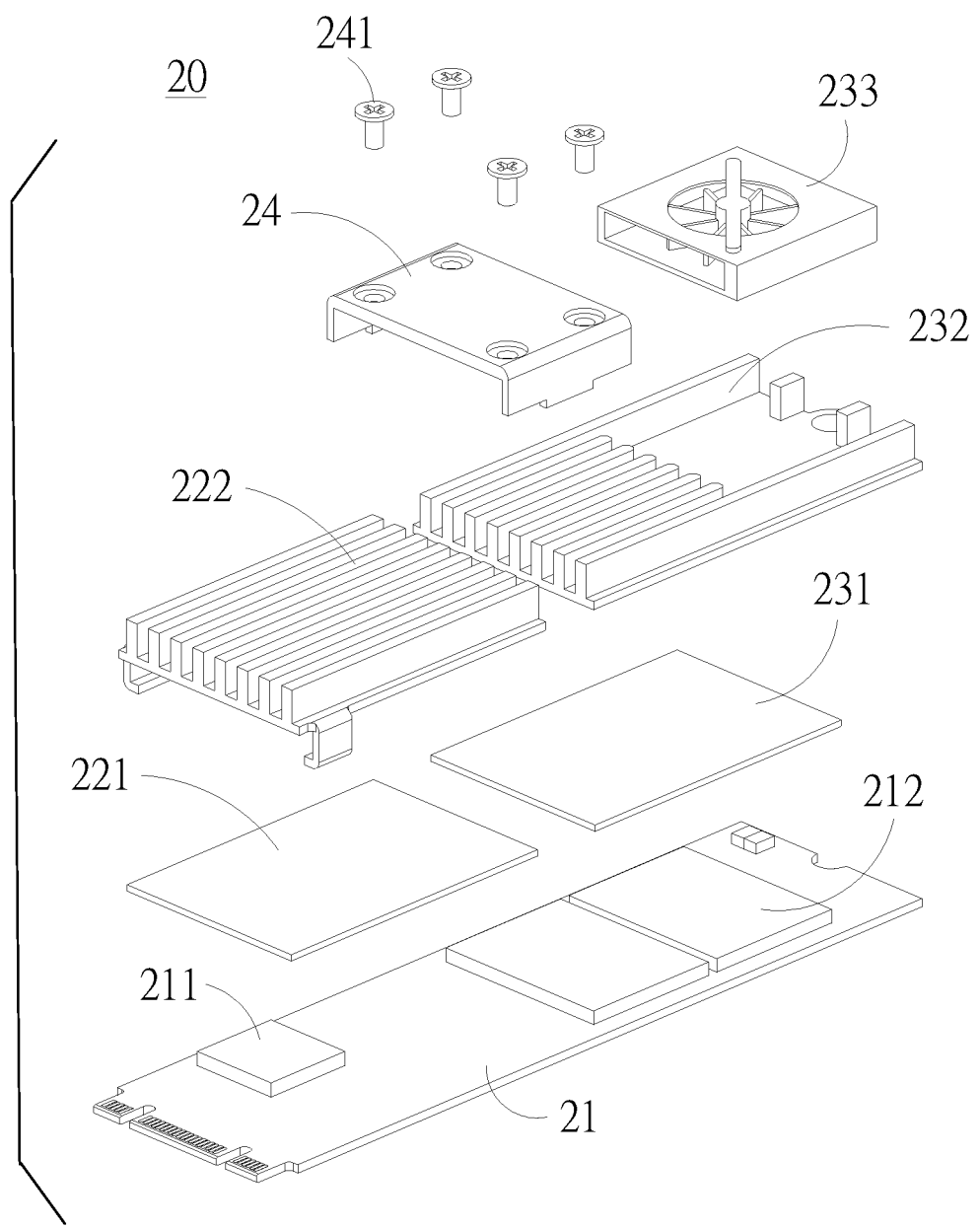
FIG. 2 is an exploded view of the solid-state drive heat dissipation device according to another embodiment of the invention.
Figure 3:
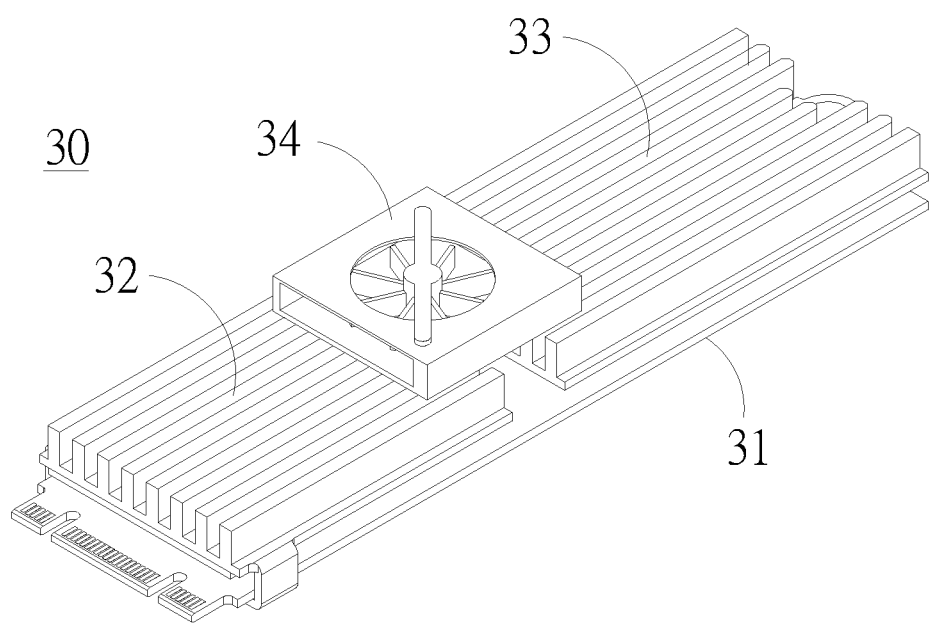

Please refer to FIG. 2, which is an exploded view of a solid-state drive heat dissipation device according to an embodiment of the invention. As shown in FIG. 2, the solid-state drive heat dissipation device 20 comprises a solid-state drive substrate 21 on which a control IC 211 and a flash memory 212 are disposed. The control IC 211 and flash memory 212 can be operated by circuit connections on a printed circuit board (PCB). In this embodiment, the chip heat dissipation component comprises a chip heat dissipation sheet 221 and chip heat dissipation fins 222. The chip heat dissipation sheet 221 is disposed on the control IC 211, and the chip heat dissipation fins 222 are disposed on the chip heat dissipation sheet 221. In addition, the memory heat dissipation component further comprises a memory heat dissipation sheet 231, memory heat dissipation fins 232 and a memory fan 233. The memory heat dissipation sheet 231 is disposed on the flash memory 212. The memory heat dissipation fins 232 is disposed on the memory heat dissipation sheet 231. The memory fan 233 is disposed on the memory heat dissipation fins 232. In this embodiment, the chip heat dissipation component and the memory heat dissipation component both comprise a heat dissipation sheet and heat dissipation fins, and the heat dissipation sheet can be in contact with the control IC 211 or the flash memory 212, and the heat dissipation area is increased by the heat dissipation fins to increase heat dissipation effect. However, this invention is not limited thereto, and the heat dissipation sheet or the heat dissipation fins may be independently disposed to dissipate heat.

As for the spacer 24, it may be a plastic cover, which can be locked on the solid-state drive substrate 21 by screws 241 to separate the chip heat dissipation component and the memory heat dissipation component, so as to prevent the heat conduction between the two heat dissipation components, causing the components overheating. In addition, since the control IC 211 can be provided with an over-temperature protection mechanism, the over-temperature protection mechanism can adjust the performance of the control IC 211 to cool down when the operating temperature is too high. For example, the frequency of the processor may be adjusted to decrease the processing speed and return to the original working frequency after the temperature returns to normal. However, the flash memory 212 may lose data when the temperature is too high, and this is unrecoverable. Therefore, in order to prevent the temperature of the flash memory 212 from being too high, the memory fan 233 may be further disposed on the memory side. The airflow generated by the fan can more quickly dissipate heat to keep the flash memory 212 in a normal operating state and avoid loss of stored data. In this embodiment, the memory fan 233 is disposed on the flash memory 212 in a single fan manner, but the single fan may also be disposed on the control IC 211 or cover both the control IC 211 and the flash memory 212. For details, refer to the following embodiments.

Figure 4:
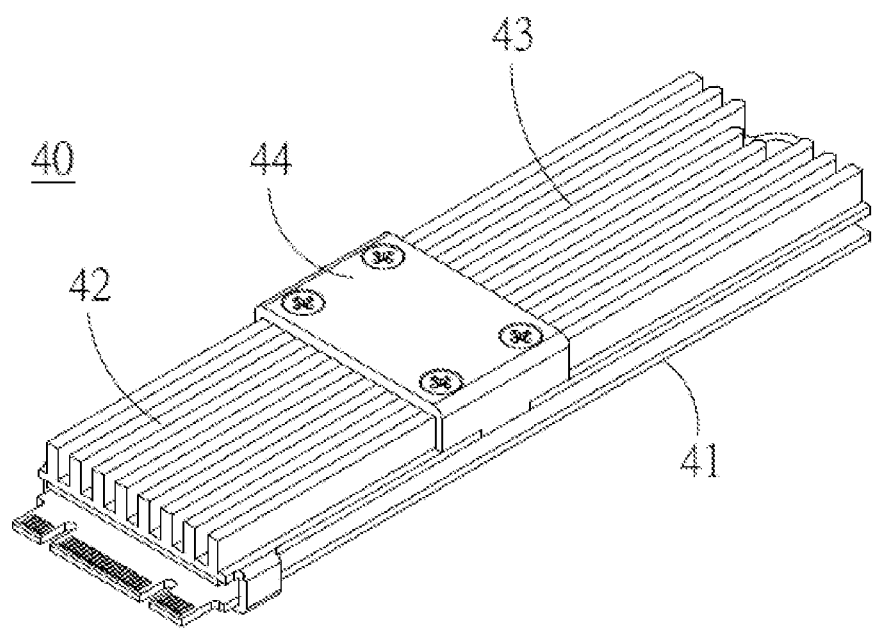
FIG. 4 is an another schematic view of the solid-state drive heat dissipation device according to another embodiment of the invention.

Please refer to FIG. 4, which is an another schematic view of the solid-state drive heat dissipation device according to another embodiment of the invention. As shown in FIG. 4, the solid-state drive heat dissipation device 40 comprises a solid-state drive substrate 41, a chip heat dissipation component 42, a memory heat dissipation component 43, and a spacer 44. The difference between FIG. 1 and FIG. 4 is the spacer 44 prevents the thermal energy from affecting each other. Therefore, the spacer 44 may be selected from materials having a low thermal conductivity, such as a plastic material. The thermal energy generated by the control IC and the flash memory during operation are respectively conducted by the chip heat dissipation component 42 and the memory heat dissipation component 43 separated by the spacer 44, and hence no problems of decreasing the overall solid-state drive performance or data loss is produced by the mutual influence.

Figure 5:
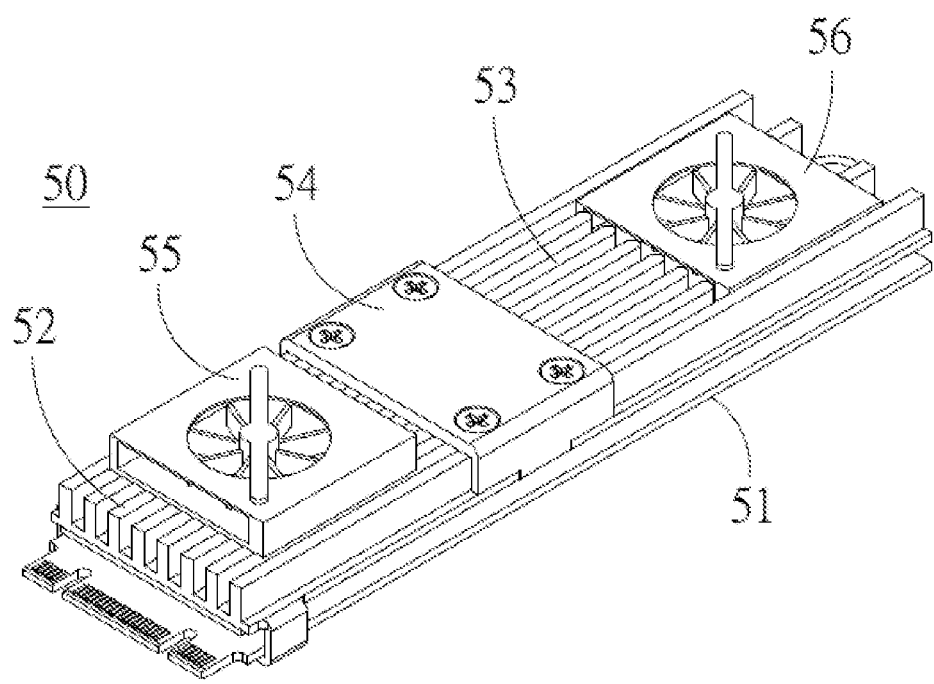
FIG. 5 is a schematic view of the chip fan and a memory fan according to still another embodiment of the invention.

Please refer to FIG. 5, which is a schematic diagram of a chip fan and a memory fan according to an embodiment of the invention. As shown in FIG. 5, the solid-state drive heat dissipation device 50 comprises a solid-state drive substrate 51, a chip heat dissipation component 52, a memory heat dissipation component 53, and a spacer 54. The chip heat dissipation component 52 and the memory heat dissipation component 53 are disposed on the solid-state drive substrate 51. The spacer 54 is disposed between the chip heat dissipation component 52 and the memory heat dissipation component 53. The components in FIG. 5 are similar to the components in FIG. 2. The description of the same components is shown in the foregoing embodiments and will not be repeatedly described. In this embodiment, the chip fan 55 can be disposed on the chip heat dissipation component 52, that is, the chip heat dissipation fins. In contrast, the memory fan 56 can be disposed on the memory heat dissipation component 53, that is, the memory heat dissipation fins. The chip fan 55 and the memory fan 56 can be independently controlled by a control device, depending on the operating state of the solid-state drive. The chip fan 55 is activated when the temperature of the control IC is raised to effectively reduce the temperature of the control IC without slowing down the control IC's speed. Similarly, the memory fan 56 can also be activated when the flash memory detects a temperature rise to prevent the temperature from rising continuously. Since the operating temperature of the control IC and the flash memory are not exactly the same, the heat resistance and heat resistant time are also different. The advantage of separately setting the fan is that different starting temperatures can be set, and the effective heat dissipation of each component is performed to improve the heat dissipation efficiency.

While the disclosure is described with some preferred embodiments, it is understood that many changes and modifications in the described embodiments can be carried out without departing from the scope and the spirit of the inventive concept that is intended to be limited only by the appended claims.

What is claimed is:

1. A solid-state drive heat dissipation device, comprising:
    a solid-state drive substrate comprising a control IC and a flash memory disposed on the solid-state drive substrate;
    a chip heat dissipation component disposed on the control IC;
    a memory heat dissipation component disposed on the flash memory, wherein the chip heat dissipation component and the memory heat dissipation component are disposed separately; and
    a spacer disposed on the solid-state drive substrate as well as between the control IC and the flash memory to separate the chip heat dissipation component and the memory heat dissipation component.

2. The solid-state drive heat dissipation device of claim 1, wherein the chip heat dissipation component comprises a chip heat dissipation sheet disposed on the control IC.

3. The solid-state drive heat dissipation device of claim 2, wherein the chip heat dissipation component comprises chip heat dissipation fins disposed on the chip heat dissipation sheet.

4. The solid-state drive heat dissipation device of claim 3, wherein the chip heat dissipation component comprises a chip fan disposed on the chip heat dissipation fins.

5. The solid-state drive heat dissipation device of claim 1, wherein the memory heat dissipation component comprises a memory heat dissipation sheet disposed on the flash memory.

6. The solid-state drive heat dissipation device of claim 5, wherein the memory heat dissipation component comprises memory heat dissipation fins disposed on the memory heat dissipation sheet.

7. The solid-state drive heat dissipation device of claim 6, wherein the memory heat dissipation component comprises a memory fan disposed on the memory heat dissipation fins.

8. The solid-state drive heat dissipation device of claim 1,
   wherein the chip heat dissipation component comprises:
      a chip heat dissipation sheet disposed on the control IC; and
      chip heat dissipation fins disposed on the chip heat dissipation sheet; and
   wherein the memory heat dissipation component comprises:
      a memory heat dissipation sheet disposed on the flash memory; and
      memory heat dissipation fins disposed on the memory heat dissipation sheet.

9. The solid-state drive heat dissipation device of claim 1, further comprising a heat dissipation fan disposed on the spacer, wherein the heat dissipation fan covers a portion of the chip heat dissipation fins and a portion of the memory heat dissipation fins.

* * * * *